(12) United States Patent
Meng et al.

(10) Patent No.: US 10,777,588 B2
(45) Date of Patent: Sep. 15, 2020

(54) METHOD OF FABRICATING THIN FILM TRANSISTOR, THIN FILM TRANSISTOR, ARRAY SUBSTRATE, AND DISPLAY APPARATUS

(71) Applicants: BOE TECHNOLOGY GROUP CO., LTD., Beijing (CN); PEKING UNIVERSITY, Beijing (CN)

(72) Inventors: Hu Meng, Beijing (CN); Xuelei Liang, Beijing (CN); Jiye Xia, Beijing (CN); Boyuan Tian, Beijing (CN); Guodong Dong, Beijing (CN); Qi Huang, Beijing (CN)

(73) Assignees: BOE TECHNOLOGY GROUP CO., LTD., Beijing (CN); PEKING UNIVERSITY, Beijing (CN)

( * ) Notice: Subject to any disclaimer, the term of this patent is extended or adjusted under 35 U.S.C. 154(b) by 0 days.

(21) Appl. No.: 16/341,012

(22) PCT Filed: Aug. 13, 2018

(86) PCT No.: PCT/CN2018/100236
§ 371 (c)(1),
(2) Date: Apr. 10, 2019

(87) PCT Pub. No.: WO2019/042118
PCT Pub. Date: Mar. 7, 2019

(65) Prior Publication Data
US 2020/0185422 A1 Jun. 11, 2020

(30) Foreign Application Priority Data

Aug. 31, 2017 (CN) .......................... 2017 1 0774682

(51) Int. Cl.
*H01L 27/12* (2006.01)
*C01B 32/168* (2017.01)
(Continued)

(52) U.S. Cl.
CPC .......... *H01L 27/127* (2013.01); *C01B 32/168* (2017.08); *C01F 7/422* (2013.01);
(Continued)

(58) Field of Classification Search
CPC ..................................................... H01L 27/127
See application file for complete search history.

(56) References Cited

U.S. PATENT DOCUMENTS 7,696,022 B2 * 4/2010 Ikeda ................ H01L 29/78696
438/149
9,412,442 B2 * 8/2016 Pop ..................... G11C 13/0004
(Continued)

FOREIGN PATENT DOCUMENTS

CN 101273459 A 9/2008
CN 102428564 A 4/2012
(Continued)

OTHER PUBLICATIONS

M. Ghadiry et al., "An analytical approach to calculate effective channel length in graphene nanoribbon field effect transistors", Mictroelectronics Reliability, vol. 53, Elsevier,2012, pp. 540-543. (Year: 2013).*

(Continued)

*Primary Examiner* — William Coleman
(74) *Attorney, Agent, or Firm* — Intellectual Valley Law, P.C.

(57) ABSTRACT

The present application provides a method of fabricating a thin film transistor. The method includes selecting a nano-structure material having a monotonic relationship between a threshold voltage and a channel length when the nano-structure material is formed as a channel part in a thin film transistor; forming an active layer using the nano-structure material; determining a nominal channel length of a channel part of the thin film transistor based on the monotonic (Continued)

relationship and a reference threshold voltage so that the thin film transistor is formed to have a nominal threshold voltage; and forming a source electrode and a drain electrode thereby forming the channel part in the active layer having the nominal channel length.

19 Claims, 3 Drawing Sheets

(51) Int. Cl.
    *C01F 17/218* (2020.01)
    *C01F 7/42* (2006.01)
    *H01L 21/02* (2006.01)
    *H01L 21/66* (2006.01)

(52) U.S. Cl.
    CPC ...... *C01F 17/218* (2020.01); *H01L 21/02178* (2013.01); *H01L 21/02192* (2013.01); *H01L 21/02244* (2013.01); *H01L 21/02266* (2013.01); *H01L 22/14* (2013.01); *H01L 27/1222* (2013.01); *C01B 2202/02* (2013.01); *C01B 2202/06* (2013.01); *C01B 2202/22* (2013.01)

(56) References Cited

U.S. PATENT DOCUMENTS

| | | | |
|---|---|---|---|
| 9,859,513 B2* | 1/2018 | Strachan | H01L 51/0558 |
| 10,438,982 B2* | 10/2019 | Kurata | H01L 27/14621 |
| 2009/0294757 A1 | 12/2009 | Wernersson et al. | |
| 2010/0295022 A1 | 11/2010 | Chang et al. | |
| 2011/0248243 A1* | 10/2011 | Chen | H01L 51/5072 257/29 |
| 2017/0194581 A1 | 7/2017 | Li | |
| 2017/0294583 A1 | 10/2017 | Liang et al. | |
| 2018/0358569 A1 | 12/2018 | Liang et al. | |
| 2018/0375045 A1 | 12/2018 | Liang et al. | |

FOREIGN PATENT DOCUMENTS

| | | |
|---|---|---|
| CN | 105336792 A | 2/2016 |
| CN | 105655406 A | 6/2016 |
| CN | 105679676 A | 6/2016 |
| CN | 106601604 A | 4/2017 |
| KR | 20170083822 A | 7/2017 |

OTHER PUBLICATIONS

Ahiyong Zhang et al., "Self-Alignted Ballistic n-Type Single-Walled Carbon Nanotube Field-Effect Transistors with Adjustable Threshold Voltage", Nano Letters, vol. 8, No. 11, 2008, pp. 3696-3707. (Year: 2008).*
Abu H. M. Ali et al., "Channel lenght effect on the saturation current and the threshold voltages of CNTFET", IEEE-ICSE2014 Proceedings, Kuala Lumpur, Malaysia, pp. 267-269. (Year: 2014).*
Venugopal et al., "Effective mobilityof single-layer graphene transistors as a function of channel dimensions", Journal of Applied Physics, vol. 109, 2011, pp. 104511-1 to 104511-5 (Year: 2011).*
International Search Report & Written Opinion dated Nov. 12 2018, regarding PCT/CN2018/100236.
Channel length effect on the saturation current and the threshold voltages of CNTFET, Abu Hanifah Muhamad Ali et al., IEEE International Conference on Semiconductor Electronics (ICSE), 2014 : Aug. 27-29, 2014, Kuala Lumpur, Malaysia; proceedings.
Tuning Threshold Voltage of Carbon Nanotube Thin Film Transistors by Channel Length Engineering, Guodong Dong et al., Chinese Journal of Vacuum Science and Technology, Aug. 2017, vol. 37, No. 8.
First Office Action in the Chinese Patent Application No. 201710774682. 5, dated Dec. 27, 2019; English translation attached.

* cited by examiner

METHOD OF FABRICATING THIN FILM TRANSISTOR, THIN FILM TRANSISTOR, ARRAY SUBSTRATE, AND DISPLAY APPARATUS

CROSS-REFERENCE TO RELATED APPLICATION

This application is a national stage application under 35 U.S.C. § 371 of International Application No. PCT/CN2018/100236, filed Aug. 13, 2018, which claims priority to Chinese Patent Application No. 201710774682.5, filed Aug. 31, 2017, the contents of which are incorporated by reference in the entirety.

TECHNICAL FIELD

The present invention relates to display technology, more particularly, to a method of fabricating a thin film transistor, a thin film transistor, an array substrate, and a display apparatus.

BACKGROUND

Carbon nanotubes materials have been developed as an alternative to the silicon-based material for fabricating electronic devices due to their excellent electrical and mechanical properties, including high mobility, large current density, large on/off ratio, and extraordinary mechanical strength. In particular, due to their uniformity, flexibility, and transparency, thin film transistors with carbon nanotubes as channel materials have been widely studied.

SUMMARY

In one aspect, the present invention provides a method of fabricating a thin film transistor, comprising selecting a nano-structure material having a monotonic relationship between a threshold voltage and a channel length when the nano-structure material is formed as a channel part in a thin film transistor, forming an active layer using the nano-structure material; determining a nominal channel length of a channel part of the thin film transistor based on the monotonic relationship and a reference threshold voltage so that the thin film transistor is formed to have a nominal threshold voltage; and forming a source electrode and a drain electrode thereby forming the channel part in the active layer having the nominal channel length.

Optionally, the method further comprises determining the monotonic relationship of the nano-structure material; wherein determining the monotonic relationship comprises fabricating a plurality of thin film transistors using the nano-structure material as a semiconductor material of channel parts of the plurality of thin film transistors, the plurality of thin film transistors formed to have respectively a plurality of channel lengths; and measuring a plurality of threshold voltages of the plurality of thin film transistors.

Optionally, a difference between the nominal threshold voltage and the reference threshold voltage is less than a first threshold value; wherein determining the nominal channel length comprises selecting one of the plurality of threshold voltages of the plurality of thin film transistors having a difference with respect to the reference threshold voltage less than the first threshold value as a closest threshold voltage; and selecting a channel length of one of the plurality of thin film transistors having the closest threshold voltage as the nominal channel length.

Optionally, determining the nominal channel length comprises establishing a monotonic relationship function based on the plurality of threshold voltages of the plurality of thin film transistors and the plurality of channel lengths of the plurality of thin film transistors; using the monotonic relationship function to determine a selected channel length corresponding to the reference threshold voltage; and using the selected channel length as the nominal channel length.

Optionally, measuring the plurality of threshold voltages of the plurality of thin film transistors comprises measuring threshold voltage-associated electrical properties of the plurality of thin film transistors.

Optionally, the method further comprises determining a nominal channel width of the channel part of the thin film transistor, wherein determining the nominal channel width comprises fabricating a plurality of thin film transistors using the nano-structure material as a semiconductor material of channel parts of the plurality of thin film transistors, the plurality of thin film transistors formed to have respectively a plurality of channel widths; measuring drain currents of the plurality of thin film transistors at a same drain-source voltage; and selecting a channel width of a selected one of the plurality of thin film transistors as the nominal channel width; wherein a drain current of the selected one of the plurality of thin film transistors at the same drain-source voltage has a difference with respect to a reference drain current less than a second threshold value.

Optionally, the monotonic relationship is a monotonic inverse relationship.

Optionally, selecting the nano-structure material having the monotonic relationship comprises selecting a carbon nanotubes material or a semiconductor nanowire material.

Optionally, the carbon nanotubes material comprises one or a combination of a single-wall carbon nanotubes material, a double-wall carbon nanotubes material, and a carbon nanotubes bundle material.

Optionally, forming the active layer comprises forming a nano-structure material layer by one or a combination of a deposition process, a dip coating process, a spraying process, a knife-coating process, and a printing process.

Optionally, forming the nano-structure material layer comprises forming a high-purity carbon nanotubes network thin film.

Optionally, forming the active layer further comprises patterning the nano-structure material layer by a lithography process or a reactive-ion etching process thereby forming the active layer.

Optionally, the method further comprises, prior to forming the nano-structure material layer, treating a base substrate by a wet chemical cleaning process.

Optionally, the method further comprises, subsequent to forming the nano-structure material layer, cleaning a substrate having the nano-structure material layer formed thereon with a solvent; and drying the substrate.

Optionally, the method further comprises forming a first passivation layer comprising a metal oxide material on the channel part.

Optionally, forming the first passivation layer comprises forming a yttrium material layer by an electron-beam physical vapor deposition process on the channel part; and oxidizing the yttrium material layer, wherein the yttrium material layer is formed to have a thickness in a range of approximately 1 am to approximately 4 nm; and oxidizing the yttrium material layer is performed at a temperature in a range of approximately 200 degrees to approximately 300 degrees for a duration in a range of approximately 20 minutes to approximately 40 minutes in an oxygen-containing atmosphere or by an ultraviolet oxidation process.

Optionally, the method further comprises forming a second passivation layer comprising a metal oxide material on a side of the first passivation layer distal to the channel part.

Optionally, forming the second passivation layer comprises forming an aluminum material layer by an atomic layer deposition process on side of the first passivation layer distal to the channel part; and oxidizing the aluminum material layer, wherein the aluminum material layer is formed to have a thickness in a range of approximately 50 nm to approximately 100 nm; and oxidizing the aluminum material layer is performed at a temperature in a range of approximately 150 degrees to approximately 350 degrees for a duration in a range of approximately 2 hours to approximately 3 hours.

Optionally, the channel part is formed to have a ratio between a channel width and the channel length in a range of 1:1 to 20:1.

Optionally, the nano-structure material is selected so that, when the nano-structure material is formed as the channel part, the threshold voltage is substantially independent of a channel width of the channel part.

In another aspect, the present invention provides a thin film transistor fabricated by the method described herein.

In another aspect, the present invention provides an array substrate, comprising the thin film transistor described herein or fabricated by the method described herein.

Optionally, the array substrate comprises a first thin film transistor in a display area and a second thin film transistor in a peripheral area; wherein the first thin film transistor and the second thin film transistor have different dimensions.

In another aspect, the present invention provides a display apparatus comprising the thin film transistor described herein or fabricated by the method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Carbon nanotubes (CNT) materials have been developed as an alternative to silicon-based materials for fabricating electronic devices, e.g., as channel materials for fabricating a thin film transistor. The main issues associated with carbon nanotubes thin film transistors include the considerable variation in threshold voltage and sizable gate hysteresis. Various methods have been developed to control the threshold voltage of carbon nanotubes thin film transistors, including improvements on work function of the gate electrode, doping the channel part of the thin film transistor, and adjustment of a thickness and interface charge of the gate oxide layer. However, these methods generally fail to improve the threshold voltage of carbon nanotubes thin film transistor to a controllable level, and have their limitations. For example, improving work function of the gate electrode can only adjust the threshold voltage by no more than 1 V. The doping method and the adjustment of the thickness and interface charge of the gate oxide layer involve complicated processes, and the results thereof are often unpredictable and difficult to repeat.

Figure 1:
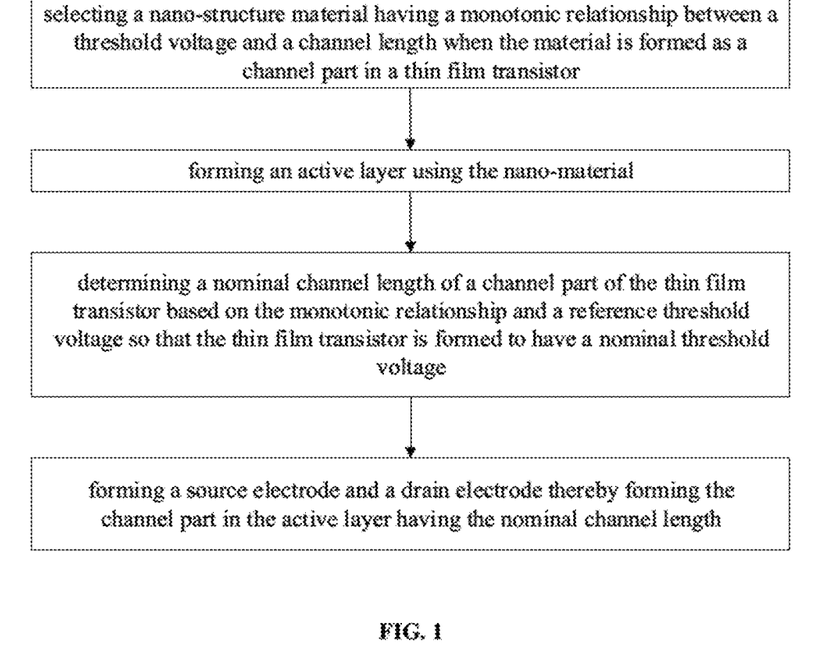
FIG. 1 is a flow chart illustrating a method of fabricating a thin film transistor in some embodiments according to the present disclosure.

Accordingly, the present disclosure provides, inter alia, a method of fabricating a thin film transistor, a thin film transistor, an array substrate, and a display apparatus that substantially obviate one or more of the problems due to limitations and disadvantages of the related art. In one aspect, the present disclosure provides a method of fabricating a thin film transistor. FIG. 1 is a flow chart illustrating a method of fabricating a thin film transistor in some embodiments according to the present disclosure. Referring to FIG. 1, the method in some embodiments includes selecting a nano-structure material having a monotonic relationship between a threshold voltage and a channel length when the material is formed as a channel part in a thin film transistor; forming an active layer using the nano-structure material; determining a nominal channel length of a channel part of the thin film transistor based on the monotonic relationship and a reference threshold voltage so that the thin film transistor is formed to have a nominal threshold voltage; and forming a source electrode and a drain electrode thereby forming the channel part in the active layer having the nominal channel length. Optionally, the method further includes forming a gate electrode and a gate insulating layer between the gate electrode and the active layer. Optionally, the thin film transistor is a top gate-type thin film transistor. Optionally, the thin film transistor is a bottom gate-type thin film transistor.

Optionally, the difference between the nominal threshold voltage and the reference threshold voltage is less than a first threshold value such that the nominal threshold voltage and the reference threshold voltage are within ±20% (e.g., ±15%, ±10%, ±5%, ±2%, ±1%) of each other.

As used herein, the term "nano-structure material" refers to a structure having at least one region or characteristic dimension with a dimension of less than about 500 urn, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanocrystals, nanotetrapods, tripods, bipods, nanocrystals, nanodots, quantum dots, nanoparticles, branched tetrapods (e.g., inorganic dendrimers), and the like. Nanostructures can be substantially homogeneous in material properties, or in certain embodiments can be heterogeneous (e.g. heterostructures). Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100. Examples of nanowire materials include a GaP semiconductor nanowire material and an InP semiconductor nanowire material.

As used herein, the term "nanotubes" generally refers to a hollow article having a narrow dimension (diameter) of about 1-200 nm and a long dimension (length), where the ratio of the long dimension to the narrow dimension, i.e., the aspect ratio, is at least 5. In general, the aspect ratio is between 10 and 2000. Examples of nanotubes materials include a single-wall carbon nanotubes material, a multi-wall carbon nanotubes material, and a carbon nanotubes bundle material.

As used herein, the term "nominal channel length" refers to the channel length the thin film transistor is designed to have, recognizing that manufacturing imperfections may cause the actual channel length to vary slightly from the design channel length. As used herein, the term "nominal threshold voltage" refers to the threshold voltage the thin film transistor is designed to have, recognizing that manufacturing imperfections may cause the actual pitch to vary slightly from the design pitch.

As used herein, the term "monotonic relationship" refers to a relationship in which (1) an increase in the value of one variable is always accompanied by an increase in other variable; or (2) an increase in the value of one variable is always accompanied by a decrease in other variable.

As used herein, the term "source electrode contact part" refers to a part of the active layer in contact with the source electrode. As used herein, the term "drain electrode contact part" refers to a part of the active layer in contact with the drain electrode. As used herein, the term "channel part" refers to a part of the active layer between the source electrode contact part and the drain electrode contact part. The channel part allows electrical communication between the source electrode and the drain electrode.

As used herein, the term "channel length" is intended to mean a dimension of a channel part of a thin film transistor, wherein the dimension represents a minimum distance between a source electrode contact part and a drain electrode contact part. From a top view, the channel length is typically in a direction that is substantially perpendicular to channel-source interface, channel-drain interface, channel-source/drain interface, or the like.

Optionally, the channel length describes the dimension of the channel part in a direction parallel to the designed direction of carrier flow when the channel part is "on". For example, the channel length can be the shortest distance from one source/drain region of a transistor to the other.

As used herein, the term "channel width" is intended to mean a dimension of a channel part of a thin film transistor, wherein the dimension is measured in a direction substantially perpendicular to the channel length. From a top view, the channel width typically extends from one channel region-field isolation region interface to an opposite channel region-field isolation region interface. Optionally, the channel width describes the dimension of the channel part in a direction perpendicular to the designed direction of carrier flow when the channel part is "on".

In some embodiments, the method further includes determining the monotonic relationship of the nano-structure material. Optionally, the step of determining the monotonic relationship of the nano-structure material includes fabricating a plurality of thin film transistors using the nano-structure material as a semiconductor material of channel parts of the plurality of thin film transistors, the plurality of thin film transistors formed to have respectively a plurality of channel lengths; and measuring a plurality of threshold voltages of the plurality of thin film transistors. If a monotonic relationship is found between the threshold voltages of the plurality of thin film transistors and the channel lengths of the plurality of thin film transistors, it can be determined that the nano-structure material has a monotonic relationship between a threshold voltage and a channel length when the material is formed as a channel part in a thin film transistor. If a monotonic relationship is absent between the threshold voltages of the plurality of thin film transistors and the channel lengths of the plurality of thin film transistors, it can be determined that the nano-structure material does not possess a monotonic relationship between a threshold voltage and a channel length when the material is formed as a channel part in a thin film transistor. By testing a plurality of thin film transistors having channel parts of different dimensions (e.g., channel length, channel width, aspect ratio, etc.), a relationship between the channel length and the threshold voltage can be determined (monotonic or non-monotonic). A nano-structure material having a monotonic relationship between a threshold voltage and a channel length when the material is formed as a channel part in a thin film transistor is then selected as the material for making the active layer of the thin film transistor.

In some embodiments, the step of measuring threshold voltages of the plurality of thin film transistors includes measuring threshold voltage-associated electrical properties of the plurality of thin film transistors. Appropriate threshold voltage-associated electrical properties include, for example, electrical parameters in a transfer characteristic curve and electrical parameters in an output characteristic curve. Optionally, measuring threshold voltages of the plurality of thin film transistors includes deriving the threshold voltages of the plurality of thin film transistors based on the threshold voltage-associated electrical properties. Optionally, the threshold voltages of the plurality of thin film transistors having different channel lengths can be derived based on the electrical parameters in the transfer characteristic curve and the electrical parameters in the output characteristic curve. Optionally, measuring threshold voltages of the plurality of thin film transistors includes measuring threshold voltage-associated electrical properties of the plurality of thin film transistors without directly deriving the values of the threshold voltages. Optionally, the electrical properties (e.g., the electrical parameters in the transfer characteristic curve and the electrical parameters in the output characteristic curve) are used in lieu of values of threshold voltages in subsequent steps.

In some embodiments, a difference between the nominal threshold voltage and the reference threshold voltage is less than a first threshold value, and the step of determining the nominal channel length of the channel part of the active layer includes selecting one of the plurality of threshold voltages of the plurality of thin film transistors having a difference with respect to the reference threshold voltage less than the first threshold value as a closest threshold voltage; and selecting a channel length of one of the plurality of thin film transistors having the closest threshold voltage as the nominal channel length.

In some embodiments, the step of determining the nominal channel length of the channel part of the active layer includes establishing a monotonic relationship function based on the plurality of threshold voltages of the plurality of thin film transistors and the plurality of channel lengths of the plurality of thin film transistors; using the monotonic relationship function to determine a selected channel length corresponding to the reference threshold voltage; and using the selected channel length as the nominal channel length.

In some embodiments, the step of determining the nominal channel length of the channel part of the active layer includes selecting one of the threshold voltage-associated electrical properties of the plurality of thin film transistors having a difference with respect to a reference threshold voltage-associated electrical property less than the first threshold value as a closest threshold voltage-associated electrical property; and selecting a channel length of one of the plurality of thin film transistors having the closest threshold voltage-associated electrical property as the nominal channel length. Optionally, the step of selecting one of the threshold voltage-associated electrical properties of the plurality of thin film transistors includes comparing profiles of transfer characteristic curves of the plurality of thin film transistors with a profile of a reference transfer characteristic curve. Optionally, the step of selecting one of the threshold voltage-associated electrical properties of the plurality of thin film transistors includes comparing profiles of output characteristic curves of the plurality of thin film transistors with a profile of a reference output characteristic curve.

In some embodiments, the method further includes determining a nominal channel width of the channel part of the thin film transistor. In some embodiments, the step of determining the nominal channel width includes fabricating a plurality of thin film transistors using the nano-structure material as a semiconductor material of channel parts of the plurality of thin film transistors, the plurality of thin film transistors formed to have a plurality of channel widths; measuring drain currents of the plurality of thin film transistors at a same drain-source voltage; and selecting a channel width of a selected one of the plurality of thin film transistors as the nominal channel width. A drain current of the selected one of the plurality of thin film transistors at the same drain-source voltage has a difference with respect to a reference drain current less than a second threshold value. As used herein, the term "drain-source voltage" refers to voltage value of a voltage applied between a drain electrode and a source electrode of a thin film transistor. As used herein, the term "drain current" refers to current value of a current between a drain electrode and a source electrode of a thin film transistor. Optionally, the plurality of thin film transistors fabricated for determining the nominal channel width all have a substantially same channel length, e.g., a substantially same nominal channel length determined in a previous step. Optionally, the drain current of the selected one of the plurality of thin film transistors at the same drain-source voltage has a difference with respect to a reference drain current less than a second threshold value such that the drain current and the reference drain current are within ±20% (e.g., ±15%, ±10%, ±5%, ±2%, ±1%) of each other.

In some embodiments, the monotonic relationship is a monotonic inverse relationship, e.g., an increase in the threshold voltage is always accompanied by a decrease in the channel length, and, a decrease in the threshold voltage is always accompanied by an increase in the channel length.

Optionally, selecting the nano-structure material having the monotonic relationship includes selecting a carbon nanotubes material or a semiconductor nanowire material. Optionally, selecting the nano-structure material having the monotonic relationship includes selecting a semiconductor nanowire material. Optionally, the carbon nanotubes material includes one or a combination of a single-wall carbon nanotubes material, a double-wall carbon nanotubes material, and a carbon nanotubes bundle material.

In some embodiments, the active layer includes a channel part, a source electrode contact part, and a drain electrode contact part. The source electrode contact part is in contact with the source electrode of the thin film transistor, and the drain electrode contact part is in contact with the drain electrode of the thin film transistor. Optionally, an orthographic projection of the source electrode on a base substrate overlaps with an orthographic projection of the source electrode contact part on the base substrate, and an orthographic projection of the drain electrode on a base substrate overlaps with an orthographic projection of the drain electrode contact part on the base substrate. Optionally, the channel part is between the source electrode contact part and the drain electrode contact part. Optionally, an orthographic projection of the channel part on the base substrate is substantially non-overlapping with orthographic projections of the source electrode and the drain electrode on the base substrate. By forming the source electrode (in contact with the source electrode contact part) and the drain electrode (in contact with the drain electrode contact part), the channel part of the active layer is formed.

In some embodiments, the step of forming the active layer includes forming a nano-structure material layer (e.g., a carbon nanotubes material layer or a semiconductor nanowire material layer) by one or a combination of a deposition process, a dip coating process, a spraying process, a knife-coating process, and a printing process. Optionally, the nano-structure material layer is formed as a thin film, e.g., a high-purity carbon nanotubes network thin film. Optionally, the step of forming the nano-structure material layer is performed using a solvent to disperse the nano-structure material. Optionally, the solvent is an organic solvent such as toluene, dimethyl benzene, chloroform, and ortho-xylene. Optionally, the solvent is an inorganic solvent such as chlorosulfonic acid.

In some embodiments, the step of forming the active layer further includes patterning the nano-structure material layer (e.g., the carbon nanotubes material layer or the semiconductor nanowire material layer). Various appropriate patterning processes may be used in this step. Examples of appropriate patterning processes include a lithography process and a reactive-ion etching process.

In some embodiments, the method further includes, prior to forming the nano-structure material layer (e.g., the carbon nanotubes material layer or the semiconductor nanowire material layer, treating a base substrate, e.g., by a wet chemical cleaning process).

In some embodiments, the method further includes forming a gate electrode and forming a gate insulating layer. Optionally, the thin film transistor is a bottom gate-type thin film transistor, the gate electrode and the gate insulating layer are formed prior to forming the nano-structure material layer. Optionally, the thin film transistor is a top gate-type thin film transistor, the nano-structure material layer is formed prior to forming the gate electrode and forming the gate insulating layer.

Various appropriate electrode materials and various appropriate fabricating methods may be used to make the gate electrode. For example, an electrode material may be deposited on the substrate, e.g., by sputtering or vapor deposition or solution coating; and patterned. Examples of appropriate electrode materials for making the gate electrode include, but are not limited to, silicon, aluminum, molybdenum, aluminum Neodymium (AlNd), copper, molybdenum Niobium (MoNb), alloys and laminates thereof (e.g., a molybdenum-aluminum-molybdenum laminated structure).

Various appropriate insulating materials and various appropriate fabricating methods may be used to make the gate insulating layer. For example, a surface of the gate electrode may be oxidized to form the gate insulating layer (a gate oxide layer). Examples of appropriate gate insulating materials include silicon oxide and aluminum oxide. In another example, an insulating material may be deposited on the substrate by a plasma-enhanced chemical vapor deposition (PECVD) process. Examples of appropriate insulating materials for making the insulating layer further include silicon oxide ($SiO_y$), silicon nitride ($SiN_y$, e.g., $Si_3N_4$), silicon oxynitride ($SiO_xN_y$), and polyimide.

In some embodiments, the step of forming the nano-structure material layer includes depositing a thin film of the nano-structure material dispersed in the solvent (e.g., an organic solvent). Optionally, the thin film transistor is a bottom gate-type thin film transistor, and the thin film of the nano-structure material is formed on a substrate having the gate electrode and the gate insulating layer formed thereon.

In some embodiments, the method further includes, subsequent to forming the nano-structure material layer (e.g., the carbon nanotubes material layer or the semiconductor nanowire material layer), cleaning the substrate having the nano-structure material layer formed thereon with a solvent (e.g., toluene, dimethyl benzene, chloroform, and ortho-xylene); and drying the substrate.

In one example, the method includes treating the substrate by a wet chemical cleaning process, soaking the substrate in a solution having the nano-structure material dispersed in an organic solvent for a soaking duration, taking the substrate out, cleaning the substrate having the nano-structure material layer formed thereon with ortho-xylene, drying the substrate, and patterning the nano-structure material layer by a lithography process or a reactive-ion etching process.

In some embodiments, the method further includes forming a source electrode and a drain electrode. The source electrode is formed to be in contact with the source electrode contact part of the active layer, and the drain electrode is formed to be in contact with the drain electrode contact part of the active layer.

In some embodiments, the method further includes forming a first passivation layer including a metal oxide material on the channel part. By forming the first passivation layer on the channel part, the electrical properties of the thin film transistor can be enhanced. For example, the carrier mobility and stability of the thin film transistor can be improved by having the first passivation layer on the channel part. Optionally, the step of forming the first passivation layer includes forming a yttrium material layer by an electron-beam physical vapor deposition process on the channel part; and oxidizing the yttrium material layer.

Optionally, the yttrium material layer is formed to have a thickness in a range of approximately 1 nm to approximately 4 nm. Optionally, the step of oxidizing the yttrium material layer is performed at a temperature in a range of approximately 200 degrees to approximately 300 degrees for a duration in a range of approximately 20 minutes to approximately 40 minutes in an oxygen-containing atmosphere or by an ultraviolet oxidation process.

In some embodiments, the method further includes forming a second passivation layer including a metal oxide material on a side of the first passivation layer distal to the channel part. By forming the second passivation layer, the thin film transistor can be formed to be more moist-resistant and oxygen-resistant. Optionally, the step of forming the second passivation layer includes forming an aluminum material layer by an atomic layer deposition process on side of the first passivation layer distal to the channel part; and oxidizing the aluminum material layer. Optionally, the aluminum material layer is formed to have a thickness in a range of approximately 50 am to approximately 100 nm. Optionally, the step of oxidizing the aluminum material layer is performed at a temperature in a range of approximately 150 degrees to approximately 350 degrees for a duration in a range of approximately 2 hours to approximately 3 hours.

In some embodiments, the channel part is formed to have a ratio between a channel width and the channel length in a range of 1:1 to 20:1, e.g., 1:1 to 2:1.2:1 to 5:1, 5:1 to 10:1, 10:1 to 15:1, and 15:1 to 20:1.

Figure 2:
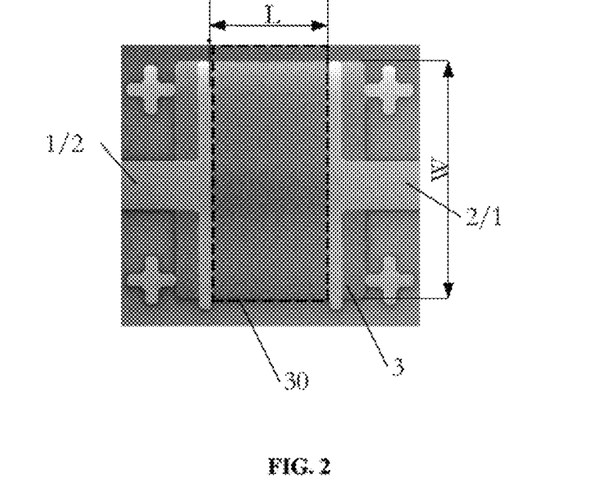
FIG. 2 is a scanning electron microscope (SEM) image of a thin film transistor in some embodiments according to the present disclosure.
Figure 3:
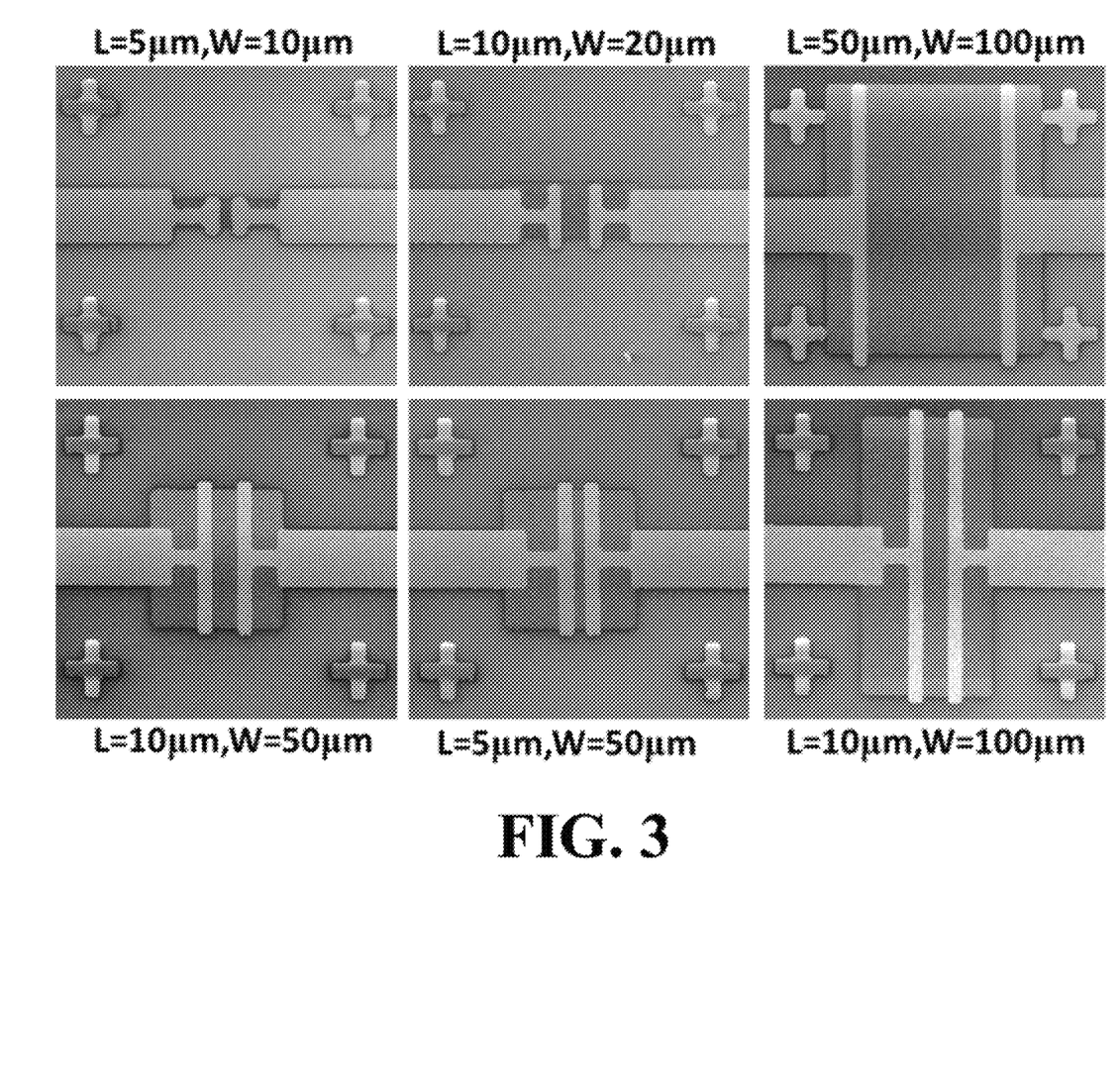
FIG. 3 is scanning electron microscope (SEM) images of several thin film transistors in some embodiments according to the present disclosure.

FIG. 2 is a scanning electron microscope (SEM) image of a thin film transistor in some embodiments according to the present disclosure. Referring to FIG. 2, a channel part 30 is formed in the active layer 3 in a region between a source electrode 1 and a drain electrode 2. A carrier flow occurs when the channel part 30 is "on". The channel length L refers to the dimension of the channel part 30 in a direction parallel to the designed direction of carrier flow when the channel part 30 is "on". The channel width W refers to the dimension of the channel part 30 in a direction perpendicular to the designed direction of carrier flow when the channel part 30 is "on". FIG. 3 is scanning electron microscope (SEM) images of several thin film transistors in some embodiments according to the present disclosure. The thin film transistors shown in FIG. 3 have different dimensions, e.g., different channel lengths L, different channel widths W, and different W:L aspect ratios.

Figure 4:
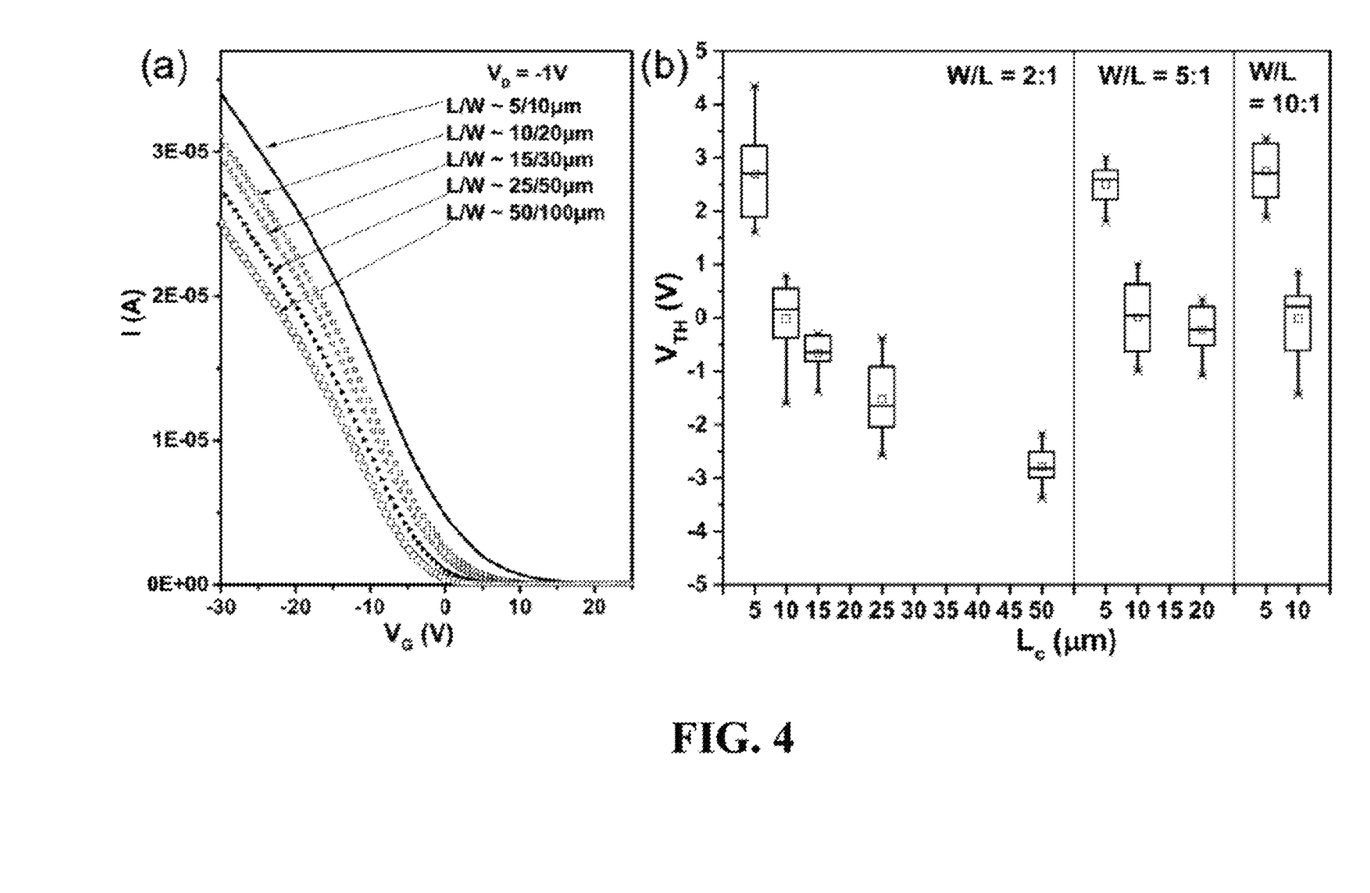
FIG. 4 shows a transfer characteristic curve (a) and a monotonic relationship between measured threshold voltages and channel lengths (b) of several thin film transistors in some embodiments according to the present disclosure.

FIG. 4 shows a transfer characteristic curve (a; left side) and a monotonic relationship between measured threshold voltages and channel lengths (b; right side) of several thin film transistors in some embodiments according to the present disclosure. Referring to FIG. 4, the thin film transistors shown in FIG. 4 all have a channel width-to-channel length aspect ratio of 2:1. The transfer characteristic curve was conducted for five thin film transistors having a ratio of channel length to channel width of (1) 5 μm: 10 μm; (2) 10 μm: 20 μm; (3) 15 μm: 30 μm; (4) 25 μm: 50 μm; and (5) 50 μm: 100 μm, respectively. The transfer characteristic curve shows the variation of the drain current I in response to a change in the gate-source voltage $V_G$, with the drain-source voltage VD maintained at −1 V. As shown in the left panel of FIG. 4, the transfer characteristic curve shifts to the left with an increase in the channel length, which indicates that the threshold voltage of the thin film transistors is dependent on the channel length. The right panel of FIG. 4 shows the monotonic relationship between the threshold voltage $V_{TH}$ and the channel length $L_C$ for thin film transistors having a channel width-channel length ratio of 2:1, 5:1, and 10:1, respectively. An increase in the channel length $L_C$ is accompanied by a decrease in the threshold voltage $V_{TH}$. Moreover, the threshold voltage $V_{TH}$ is substantially independent of the channel width of the thin film transistor. Thin film transistors having a same channel length $L_C$ but different channel width-channel length ratios still have a substantially same threshold voltage $V_{TH}$. As used herein, the term "substantially independent of" refers to two values of threshold voltages of two thin film transistors being within ±10%

(e.g., ±8%, ±5%, ±2%) of each other when the channel widths are changed from one thin film transistor to another.

The thin film transistors illustrated in FIG. 4 are fabricated on a same base substrate. Considering the carbon nanotubes material layer formed on a same base substrate has a highly uniform density distribution, the variations in the threshold voltage $V_{TH}$ in FIG. 4 can only be attributed to the changes in geometric dimensions of the channel part of the carbon nanotubes material layer. There is a monotonic relationship between the threshold voltage $V_{TH}$ and the channel length $L_C$, an increase in the channel length $L_C$ is accompanied by a decrease in the threshold voltage $V_{TH}$, and a decrease in the channel length $L_C$ is accompanied by an increase in the threshold voltage $V_{TH}$.

In another aspect, the present disclosure provides a thin film transistor fabricated by a method described herein.

In another aspect, the present disclosure provides an array substrate having a thin film transistor described herein or fabricated by a method described herein. In some embodiments, the array substrate has a display area and a peripheral area. Optionally, the array substrate includes a first thin film transistor in a display area and a second thin film transistor in a peripheral area, and the first thin film transistor and the second thin film transistor have different dimensions. Depending on the dimensions of the display area and the peripheral area, a plurality of first thin film transistors in the display area and a plurality of second thin film transistors in the peripheral area can be accordingly designed to suit the specific design requirements.

As used herein, the term "display area" refers to an area of the display substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In another aspect, the present disclosure provides a display apparatus having a thin film transistor described herein or fabricated by a method described herein. Examples of appropriate touch control display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a thin film gate transistor, comprising:

selecting a nominal threshold voltage that is desired for the thin film gate transistor;

selecting a nano-structure material having a monotonic relationship between a threshold voltage and a channel length when the nano-structure material is formed as a channel part in a thin film transistor, the threshold voltage being substantially independent of a channel width of the channel part;

forming an active layer using the nano-structure material;

using a monotonic relationship function to determine a selected channel length corresponding to a reference threshold voltage, wherein the monotonic relationship function is based on a plurality of threshold voltages of a plurality of thin film transistors and a plurality of channel lengths of the plurality of thin film transistors, wherein channel parts of the plurality of thin film transistors are made of the nano-structure material, and wherein the reference threshold voltage is a value closest to the nominal threshold voltage in the monotonic relationship function;

determining using the selected channel length as a nominal channel length of a channel part of the thin film gate transistor based on the monotonic relationship and the reference threshold voltage so that the thin film gate transistor is formed to have the nominal threshold voltage; and forming a source electrode and a drain electrode thereby forming the channel part in the active layer having the nominal channel length.

2. The method of claim 1, further comprising determining the monotonic relationship of the nano-structure material;

wherein determining the monotonic relationship comprises:

fabricating a plurality of thin film gate transistors using the nano-structure material as a semiconductor material of channel parts of the plurality of thin film gate transistors, the plurality of thin film gate transistors formed to have respectively a plurality of channel lengths; and measuring a plurality of threshold voltages of the plurality of thin film gate transistors.

3. The method of claim 1, further comprising determining a nominal channel width of the channel part of the thin film gate transistor;

wherein determining the nominal channel width comprises:

fabricating a plurality of thin film gate transistors using the nano-structure material as a semiconductor material of channel parts of the plurality of thin film gate transistors, the plurality of thin film gate transistors formed to have respectively a plurality of channel widths;

measuring drain currents of the plurality of thin film gate transistors at a same drain-source voltage; and selecting a channel width of a selected one of the plurality of thin film gate transistors as the nominal channel width;

wherein a drain current of the selected one of the plurality of thin film gate transistors at the same drain-source voltage has a difference with respect to a reference drain current less than a second threshold value.

4. The method of claim 1, wherein the monotonic relationship is a monotonic inverse relationship.

5. The method of claim 1, wherein selecting the nano-structure material having the monotonic relationship comprises selecting a carbon nanotubes material or a semiconductor nanowire material.

6. The method of claim 1, wherein forming the active layer comprises forming a nano-structure material layer by one or a combination of a deposition process, a dip coating process, a spraying process, a knife-coating process, and a printing process.

7. The method of claim 1, further comprising forming a first passivation layer comprising a metal oxide material on the channel part.

8. The method of claim 1, wherein the channel part is formed to have a ratio between a channel width and the channel length in a range of 1:1 to 20:1.

9. The method of claim 1, wherein the nano structure material is selected so that, when the nano-structure material is formed as the channel part, the threshold voltage is substantially independent of a channel width of the channel part.

10. A thin film gate transistor fabricated by the method of claim 1.

11. An array substrate, comprising the thin film gate transistor of claim 10.

12. The method of claim 2, wherein a difference between the nominal threshold voltage and the reference threshold voltage is less than a first threshold value;

wherein determining the nominal channel length comprises selecting one of the plurality of threshold voltages of the plurality of thin film gate transistors having a difference with respect to the reference threshold voltage less than the first threshold value as a closest threshold voltage; and selecting a channel length of one of the plurality of thin film gate transistors having the closest threshold voltage as the nominal channel length.

13. The method of claim 5, wherein the carbon nanotubes material comprises one or a combination of a single-wall carbon nanotubes material, a doublewall carbon nanotubes material, and a carbon nanotubes bundle material.

14. The method of claim 6, wherein forming the nano-structure material layer comprises forming a high-purity carbon nanotubes network thin film.

15. The method of claim 7, wherein forming the first passivation layer comprises:

forming a yttrium material layer by an electron-beam physical vapor deposition process on the channel part; and oxidizing the yttrium material layer;

wherein the yttrium material layer is formed to have a thickness in a range of approximately 1 nm to approximately 4 nm; and oxidizing the yttrium material layer is performed at a temperature in a range of approximately 200 degrees to approximately 300 degrees for a duration in a range of approximately 20 minutes to approximately 40 minutes in an oxygen-containing atmosphere or by an ultraviolet oxidation process.

16. The method of claim 7, further comprising forming a second passivation layer comprising a metal oxide material on a side of the first passivation layer distal to the channel part.

17. The method of claim 16, wherein forming the second passivation layer comprises:

forming an aluminum material layer by an atomic layer deposition process on side of the first passivation layer distal to the channel part; and oxidizing the aluminum material layer;

wherein the aluminum material layer is formed to have a thickness in a range of approximately 50 nm to approximately 100 nm; and oxidizing the aluminum material layer is performed at a temperature in a range of approximately 150 degrees to approximately 350 degrees for a duration in a range of approximately 2 hours to approximately 3 hours.

18. A display apparatus, comprising the thin film gate transistor of claim 10.

19. The array substrate of claim 11, comprising a first thin film gate transistor in a display area and a second thin film transistor in a peripheral area; wherein the first thin film transistor and the second thin film transistor have different dimensions.

* * * * *